United States Patent
Lines

(10) Patent No.: US 7,038,937 B2
(45) Date of Patent: *May 2, 2006

(54) DYNAMIC MEMORY WORD LINE DRIVER SCHEME

(75) Inventor: Valerie L. Lines, Ottawa (CA)

(73) Assignee: Mosaid Technologies, Inc., Kanata (CA)

(*) Notice: Subject to any disclaimer, the term of this patent is extended or adjusted under 35 U.S.C. 154(b) by 0 days.

This patent is subject to a terminal disclaimer.

(21) Appl. No.: 10/791,437

(22) Filed: Mar. 2, 2004

(65) Prior Publication Data

US 2005/0018523 A1 Jan. 27, 2005

Related U.S. Application Data

(63) Continuation of application No. 10/463,194, filed on Jun. 17, 2003, now abandoned, which is a continuation of application No. 09/919,752, filed on Jul. 31, 2001, now Pat. No. 6,603,703, which is a continuation of application No. 09/548,879, filed on Apr. 13, 2000, now Pat. No. 6,278,640, which is a continuation of application No. 09/123,112, filed on Jul. 27, 1998, now Pat. No. 6,061,277, which is a continuation of application No. 08/705,534, filed on Aug. 29, 1996, now abandoned, which is a continuation of application No. 08/611,558, filed on Mar. 6, 1996, now Pat. No. 5,751,643, which is a continuation-in-part of application No. 08/515,904, filed on Aug. 16, 1995, now Pat. No. 5,822,253, and a continuation of application No. 08/205,776, filed on Mar. 3, 1994, now abandoned, which is a continuation of application No. 08/031,898, filed on Mar. 16, 1993, now abandoned, which is a continuation of application No. 07/680,746, filed on Apr. 5, 1991, now Pat. No. 5,214,602.

(30) Foreign Application Priority Data

Apr. 6, 1990 (GB) .................. 9007790.0
Apr. 5, 1991 (JP) .................... 3-07165

(51) Int. Cl.
*G11C 11/00* (2006.01)
(52) U.S. Cl. ............... 365/154; 365/149; 365/150; 365/189.12; 365/230.01
(58) Field of Classification Search ........... 365/154, 365/189.11, 185.26, 149, 150, 189.12, 230.01
See application file for complete search history.

(56) References Cited

U.S. PATENT DOCUMENTS

| | | |
|---|---|---|
| 3,761,899 A | 9/1973 | McKenny et al. |
| 3,790,812 A | 2/1974 | Fry |
| 3,801,831 A | 4/1974 | Dame |
| 3,942,047 A | 3/1976 | Buchanan |
| 3,980,899 A | 9/1976 | Shimada et al. |
| 4,000,412 A | 12/1976 | Rosenthal et al. |
| 4,001,606 A | 1/1977 | Dingwall |
| 4,029,973 A | 6/1977 | Kobayashi et al. |
| 4,037,114 A | 7/1977 | Stewart et al. |
| 4,039,862 A | 8/1977 | Dingwall et al. |
| 4,045,691 A | 8/1977 | Asano |
| 4,047,091 A | 9/1977 | Hutchines et al. |
| 4,061,929 A | 12/1977 | Asano |
| 4,080,539 A | 3/1978 | Stewart |
| 4,106,086 A | 8/1978 | Holbrook et al. |
| 4,189,782 A | 2/1980 | Dingwall |
| 4,199,806 A | 4/1980 | Patterson, III |
| 4,208,595 A | 6/1980 | Gladstein |
| 4,216,390 A | 8/1980 | Stewart |
| 4,271,461 A | 6/1981 | Hoffmann et al. |
| 4,279,010 A | 7/1981 | Morihisa |
| 4,307,333 A | 12/1981 | Hargrove |
| 4,330,852 A | 5/1982 | Redwine et al. |
| 4,344,003 A | 8/1982 | Harmon et al. |
| 4,344,005 A | 8/1982 | Stewart |
| 4,403,158 A | 9/1983 | Slemmer |
| 4,433,253 A | 2/1984 | Zapisek |
| 4,442,481 A | 4/1984 | Brahmbhatt |
| 4,471,290 A | 9/1984 | Yamaguchi |
| 4,486,670 A | 12/1984 | Chan et al. |
| 4,533,843 A | 8/1985 | McAlexander, III et al. |

| | | |
|---|---|---|
| 4,543,500 A | 9/1985 | McAlexander et al. |
| 4,581,546 A | 4/1986 | Allan |
| 4,583,157 A | 4/1986 | Kirsch et al. |
| 4,612,462 A | 9/1986 | Asano et al. |
| 4,616,303 A | 10/1986 | Mauthe |
| 4,621,315 A | 11/1986 | Vaughn et al. |
| 4,628,214 A | 12/1986 | Leuschner |
| 4,639,622 A | 1/1987 | Goodwin et al. |
| 4,642,798 A | 2/1987 | Rao |
| 4,656,373 A | 4/1987 | Plus |
| 4,670,861 A | 6/1987 | Shu et al. |
| 4,678,941 A | 7/1987 | Chao et al. |
| 4,679,134 A | 7/1987 | Bingham et al. |
| 4,689,504 A | 8/1987 | Raghunathan et al. |
| 4,692,638 A | 9/1987 | Stiegler |
| 4,697,252 A | 9/1987 | Furuyama et al. |
| 4,716,313 A | 12/1987 | Hori et al. |
| 4,730,132 A | 3/1988 | Watanabe et al. |
| 4,733,108 A | 3/1988 | Truong |
| 4,740,918 A | 4/1988 | Okajima et al. |
| 4,751,679 A | 6/1988 | Dehganpour |
| 4,798,977 A | 1/1989 | Sakui et al. |
| 4,807,190 A | 2/1989 | Ishii et al. |
| 4,811,304 A | 3/1989 | Matsuda et al. |
| 4,814,647 A | 3/1989 | Tran |
| 4,820,941 A | 4/1989 | Dolby et al. |
| 4,823,318 A | 4/1989 | D'Arrigo et al. |
| 4,837,462 A | 6/1989 | Watanabe et al. |
| 4,843,256 A | 6/1989 | Scade et al. |
| 4,857,763 A | 8/1989 | Sakurai et al. |
| 4,873,673 A | 10/1989 | Hori et al. |
| 4,878,201 A | 10/1989 | Nakaizumi |
| 4,881,201 A | 11/1989 | Sato et al. |
| 4,888,738 A | 12/1989 | Wong et al. |
| 4,906,056 A | 3/1990 | Taniguchi |
| 4,951,259 A | 8/1990 | Sato et al. |
| 4,961,007 A | 10/1990 | Kumanoya et al. |
| 5,010,259 A | 4/1991 | Inoue et al. |
| 5,018,107 A | 5/1991 | Yoshida |
| 5,023,465 A | 6/1991 | Douglas et al. |
| 5,031,149 A | 7/1991 | Matsumoto et al. |
| 5,038,325 A | 8/1991 | Douglas et al. |
| 5,038,327 A | 8/1991 | Akaogi |
| 5,051,959 A | 9/1991 | Nakano et al. |
| 5,059,815 A | 10/1991 | Bill et al. |
| 5,086,238 A | 2/1992 | Watanabe et al. |
| 5,101,381 A | 3/1992 | Kouzi |
| 5,103,113 A | 4/1992 | Inui et al. |
| 5,150,325 A | 9/1992 | Yanagisawa et al. |
| 5,151,616 A | 9/1992 | Komuro |
| 5,159,215 A | 10/1992 | Murotani |
| 5,196,996 A | 3/1993 | Oh |
| 5,197,033 A | 3/1993 | Watanabe et al. |
| 5,208,776 A | 5/1993 | Nasu et al. |
| 5,245,576 A | 9/1993 | Foss et al. |
| 5,262,999 A | 11/1993 | Etoh et al. |
| 5,264,743 A | 11/1993 | Nakagome et al. |
| 5,276,646 A | 1/1994 | Kim et al. |
| 5,297,097 A | 3/1994 | Etoh et al. |
| 5,307,315 A | 4/1994 | Oowaki et al. |
| 5,311,476 A | 5/1994 | Kajimoto et al. |
| 5,323,354 A | 6/1994 | Matsumoto et al. |
| 5,347,488 A | 9/1994 | Matsusbita |
| 5,351,217 A | 9/1994 | Jeon |
| 5,377,156 A | 12/1994 | Watanabe et al. |
| 5,602,771 A | 2/1997 | Kajigaya et al. |
| 5,751,643 A | 5/1998 | Lines |
| 5,828,620 A | 10/1998 | Foss et al. |
| 5,912,564 A | 6/1999 | Kai et al. |
| 5,973,974 A * | 10/1999 | Shirley .................. 365/207 |
| 6,061,277 A * | 5/2000 | Lines ................ 365/189.11 |
| 6,236,581 B1 | 5/2001 | Foss et al. |

FOREIGN PATENT DOCUMENTS

| | | |
|---|---|---|
| EP | 0010137 A1 | 4/1980 |
| EP | 0197505 A2 | 10/1986 |
| GB | 2184902 A | 7/1987 |
| GB | 2204456 A | 11/1988 |
| JP | 53-90835 | 8/1978 |
| JP | 56-62066 | 5/1981 |
| JP | 59-213090 | 12/1984 |
| JP | 62-21323 | 1/1987 |
| JP | 62-73638 | 5/1987 |
| JP | 62-178013 | 8/1987 |
| JP | 62-189816 | 8/1987 |
| JP | 63-292488 | 11/1988 |
| JP | 03-086995 | 8/1989 |
| JP | 3-23590 | 1/1991 |
| WO | WO 86/04724 A1 | 8/1986 |

OTHER PUBLICATIONS

Kitsukawa, Goro, et al., "An Experimental 1-Mbit BiCMOS DRAM," *IEEE Journal of Solid-State Circuits,* V. SC-22, No. 5, Oct. 1987, pp. 657-662.

Ishihara, et al., "256k CMOS Dynamic RAM With Static Column Mode of Cycle Time of 50 ns," Nikkei Electronics, Feb. 11, 1985, pp. 243-263.

Kitsukawa, Goro, et al., "A 1-Mbit BiCMOS DRAM Using Temperature-Compensation Circuit Techniques," *IEEE Journal of Solid-State Circuits,* V. 24, No. 3, Jun. 1989, pp. 597-601.

Kitsukawa, Goro, et al., "A 23-ns 1-Mb BiCMOS DRAM," *IEEE Journal of Solid-State Circuits,* V. 25, No. 5, Oct. 1990, pp. 1102-1111.

Nakagome, Yoshinobu, et al, "An Experimental 1.5-V 64-Mb DRAM," *IEEE Journal of Solid-State Circuits,* V. 26, No. 4, Apr. 1991, pp. 465-472.

Fujii, Syuso, et al., "A 45-ns 16-Mbit DRAM with Triple-Well Structure," *IEEE Journal of Solid-State Circuits,* V. 24, No. 5, Oct. 1989, pp. 1170-1174.

Gillingham, Peter, et al., "High-Speed, High-Reliability Circuit Design for Megabit DRAM," *IEEE Journal of Solid-State Circuits,* V. 26, No. 8, Aug. 1991, pp. 1171-1175.

Fujii, S., et al., "A 45ns 16Mb DRAM with Triple-Well Structure," *1989 IEEE International Solid-State Circuits Conference (ISSCC 89),* Session 16: Dynamic RAMs, FAM 16.6, pp. 248-249, Feb. 1989.

Lu, N.C.C., et al., "A 20-ns 128-kbit × 4 High-Speed DRAM with 330-Mbit/s Data Rate", *IEEE Journal of Solid-State Circuits,* V. 23, No. 5, pp. 1140-1149, Oct. 1988.

Lu, N.C.C., et al., "A 20ns 512Kb DRAM with 83MHz Page Operation" *1989 IEEE International Solid-State Circuits Conference (ISSCC 88),* Session XVI: DYNAMIC MEMORY, FAM 16.3, Feb. 1988.

IBM Technical Disclosure Bulletin, "High Performance Complementary Decoder/Driver Circuit," V. 29, No. 6, Nov. 1986, pp. 2390-2394.

IBM Technical Disclosure Bulletin, "Improved Decoder Circuits for CMOS Memory Arrays," V. 30, No. 2, Jul. 1987, pp. 664-666.

"An Analysis of Toshiba TC511000/TC511001 CMOS 1Mx1 DRAMs," (Author Unknown), MOSAID Inc. pp. 29-36, 145-159, Aug. 1986.

Bursky, D., "Memory ICs," *Electronic Design,* V. 36, No. 4, pp. 71-81, Feb. 1988.

Kitsukawa, G., et al., "A 1-M BiCMOS DRAM Using Temperature- Compensation Circuit Technique," *IEEE Journal of Solid-State Circuits,* V. 24, No. 3, pp. 597-601, Jun. 1989.

Watanabe, T., et al., "Comparison of CMOS and BiCMOS 1-Mbit DRAM Performance," *IEEE Journal of Solid-State Circuits*, V. 24, No. 3, pp. 771-778, Jun. 1989.

Nakagome, Y., et al., "An Experimental 1.5-V 64-Mb DRAM," *IEEE Journal of Solid-State Circuits*, V. 26, No. 4, pp. 465-472, Apr. 1991.

Nakagome, Y., et al., "A 1.5V Circuit Technology for 64Mb DRAMs," *1990 Symposium on VLSI Circuits*, Honolulu, Hawaii, pp. 17-18, Jun. 1990.

Bursky, D., "Digital Technology," *Electronic Design*, V. 40, No. 4, pp. 48-61, Feb. 1992.

Schematics of Micron 1Mx4 DRAM MT4C4001DJ-8.

Aoki, Masakazu, et al., "A 1.5V DRAM for Battery-Based Applications," *IEEE Journal of Solid-State Circuits*, V. 24, No. 5, Oct. 1989, pp. 1206-1212.

Aoki, Masakazu, et al., "New DRAM Noise Generation Under Half-$V_{cc}$ Precharge and its Reduction Using a Transposed Amplifier," *IEEE Journal of Solid-State Circuits*, V. 24, No. 4, Aug. 1989, pp. 889-894.

Arimoto, Kazutami, et al., "A 60-ns 3.3-V-Only 16-Mbit DRAM with Multipurpose Register," *IEEE Journal of Solid-State Circuits*, V. 24, No. 5, Oct. 1989, pp. 1184-1189.

Arimoto, Kazutami, et al., "A Speed-Enhanced DRAM Array Architecture with Embedded ECC," *IEEE Journal of Solid-State Circuits*, V. 25, No. 1, Feb. 1990, pp. 11-17.

Asakura, Mikio, et al., "An Experimental 1-Mbit Cache DRAM with ECC," *IEEE Journal of Solid-State Circuits*, V. 25, No. 1, Feb. 1990, pp. 5-10.

Eldin, A.G., et al., "New Dynamic Logic and Memory Circuit Structures for BICMOS Technologies," *IEEE Journal of Solid-State Circuits*, V. SC-22, No. 3, Jun. 1987, pp. 450-453.

Fujii, Syuso, et al., "A 50-μA Standby 1Mx1/256Kx4 CMOS DRAM with High-Speed Sense Amplifier," *IEEE Journal of Solid-State Circuits*, V. SC-21, No. 5, Oct. 1986, pp. 643-648.

Furuyama, Tohru, et al., "An Experimental 4-Mbit CMOS DRAM," *IEEE Journal of Solid-State Circuits*, V. SC-21, No. 5, Oct. 1986, pp. 605-611.

Hori, Ryoichi, et al., "An Experimental 1 Mbit DRAM Based on High S/N Design," *IEEE Journal of Solid-State Circuits*, V. SC-19, No. 5, Oct. 1984, pp. 634-640.

Gray, Paul R., et al., "MOS Operational Amplifier Design—A Tutorial Overview," *IEEE Journal of Solid-State Circuits*, V. SC-17, No. 6, Dec. 1982, pp. 969-982.

Horiguchi, Masashi, et al., "A Tunable CMOS-DRAM Voltage Limiter with Stabilized Feedback Amplifier," *IEEE Journal of Solid-State Circuits*, V. 25, No. 5, Oct. 1990, pp. 1129-1135.

Itoh, Kiyoo, "Trends in Megabit DRAM Circuit Design," *IEEE Journal of Solid-State Circuits*, V. 25, No. 3, Jun. 1990, pp. 778-789.

Kimura, Katsutaka, et al., "A 65-ns 4-Mbit CMOS DRAM with a Twisted Driveline Sense Amplifier," *IEEE Journal of Solid-State Circuits*, V. SC-22, No. 5, Oct. 1987, pp. 651-656.

Masuoka, Fujio, et al., "A 256-kbit Flash $E^2$ PROM Using Triple-Polysilicon Technology," *IEEE Journal of Solid-State Circuits*, V. SC-22, No. 4, Aug. 1987, pp. 548-552.

Miyamoto, Jun-Ichi, et al., "An Experimental 5-V-Only 256-kbit CMOS EEPROM with a High-Performance Single-Polysilicon Cell," *IEEE Journal of Solid-State Circuits*, V. SC-21, No. 5, Oct. 1986, pp. 852-861.

Momodoni, Masaki, et al., "An Experimental 4-Mbit CMOS EEPROM with a NAND-Structured Cell," *IEEE Journal of Solid-State Circuits*, V. 24, No. 5, Oct. 1989, pp. 1238-1243.

Nakagome, Yoshinobu, et al., "Circuit Techniques for 1.5-3.6-V Battery-Operated 64-Mb DRAM," *IEEE Journal of Solid-State Circuits*, V. 25, No. 7, Jul. 1991, pp. 1003-1010.

Ohta, Kiyoto, et al., "A 1-Mbit DRAM with 33-MHz Serial I/O Ports," *IEEE Journal of Solid-State Circuits*, V. SC-21, No. 5, Oct. 1986, pp. 649-654.

Saito, Shozo, et al., "A 1-Mbit CMOS DRAM with Fast Page Mode and Static Column Mode," *IEEE Journal of Solid-State Circuits*, V. SC-20, No. 5, Oct. 1985, pp. 903-908.

Samachisa, Gheorghe, et al., "A 128K Flash EEPROM Using Double-Polysilicon Technology," *IEEE Journal of Solid-State Circuits*, V. SC-22, No. 5, Oct. 1987, pp. 676-683.

Scheuerlein, Roy E., et al., "Shared Word Line DRAM Cell," *IEEE Journal of Solid-State Circuits*, V. SC-19, No. 5, Oct. 1984, pp. 640-645.

Takada, Masahide, et al., "A 4-Mbit DRAM with Half-Internal-Voltae Bit-Line Precharge," *IEEE Journal of Solid-State Circuits*, V. SC-21, No. 5, Oct. 1986, pp. 612-617.

Takeshima, Toshio, et al., "Voltage Limiters for DRAM's with Substrate-Plate-Electrode Memory Cells," *IEEE Journal of Solid-State Circuits*, V. 23, No. 1, Feb. 1988, pp. 48-52.

Witters, Johan S., et al., "Analysis and Modeling of On-Chip High-Voltage Generator Circuits for Use in EEPROM Circuits," *IEEE Journal of Solid-State Circuits*, V. 24, No. 5, Oct. 1989, pp. 1372-1380.

Horiguchi, Masashi, et al., "Dual-Operating-Voltage Scheme for a Single 5-V 16-Mbit DRAM," *IEEE Journal of Solid-State Circuits*, V. 23, No. 5, Oct. 1988, pp. 1128-1133.

Scheuerlein, Roy E., et al., "Offset Word-Line Architecture for Scaling DRAM's to the Gigabit Level," *IEEE Journal of Solid-State Circuits*, V. 23, No. 1, Feb. 1988, pp. 41-47.

Gray, Paul R., et al., *Analog MOS Integrated Circuits, II*, IEEE Press, 1988, pp. iv-vii, 22-23.

Elmasry, Mohamed, editor. *Digital MOS Integrated Circuits II with Applications to Processors and Memory Design*, IEEE Press, 1992.

Wang, Niantsu, *Digital MOS Integrated Circuits—Design for Applications*, Prentice Hall, 1990, pp. 240-245.

Texas Instruments, Memory Products Development, "16Mbit DRAM Crib Notes," Jul. 1990, pp. 12-13.

Martin, Ken, et al., "Effects of the Op Amp Finite Gain and Bandwidth on the Performance of Switched-Capacitor Filters," *IEEE Transactions on Circuits and Systems*, V. CAS-28, No. 8, Aug. 1981, pp. 134-141.

Johns, David A., et al., *Analog Integrated Circuit Design*, John Wiley & Sons, Inc., 1997, pp. 408, 410-411, 442-443.

Keeth, Brent, et al., *DRAM Circuit Design*, Chapter 2, "The DRAM Array," John Wiley & Sons, Inc., 2000, pp. 35-68.

Reverse Engineering report—"An Analysis of the Toshiba TC511000/TC511001 CMOS 1Mx1 DRAMs," MOSAID, Aug. 1986.

Reverse Engineering full report—"An Analysis of the Toshiba TC511000/TC511001 CMOS 1Mx1 DRAMs," MOSAID, Aug. 1986.

Reverse Engineering report—Samsung KM44C4100BS-7, 6 pgs.

Reverse Engineering report—"A Design Analysis of the TMS4164," MOSAID, Aug. 1987.

Reverse Engineering report—"An Analysis of the i2164A," MOSAID, Apr. 1982.

Reverse Engineering report—Samsung KM44S64230At-GL.

Cenker, Ronald P., et al., "A Fault-Tolerant 64K Dynamic RAM," 1979 *IEEE International Solid-State Circuits Conference, (ISSCC 79)*, Session XII: Dynamics Memories, pp. 150-151 and 290, (Feb. 1979).

Hoffman, William K., et al., "An 8Kb Random-Access Memory Chip Using the One-Device FET Cell," *IEEE Journal of Solid-State Circuits,* V. SC-8, No. 5, Oct. 1973, pp. 298-305.

Komatsuzaki, K., et al., "Circuit Techniques for a Wide Word I/O Path 64 Meg DRAM," *1991 IEEE Symposium on VSLI Circuits,* Session 14: Dynamic RAM II, May 30-Jun. 1, 1991, pp. 133-134.

Weste, Neil H. E., et al., "Principles of CMOS VLSI Design," *Addision-Wesley Publishing Company,* p. 13 (1998).

\* cited by examiner

*Primary Examiner*—Richard Elms
*Assistant Examiner*—Pho M. Luu
(74) *Attorney, Agent, or Firm*—Hamilton, Brook, Smith & Reynolds, P.C.

(57) ABSTRACT

A circuit which accurately controls the word line (pass transistor gate) driving voltage to a voltage which is both controlled and is not significantly greater than is needed to drive the word line. The circuit eliminates the need for a double-boot-strapping circuit, and ensures that no voltages exceed that necessary to fully turn on a memory cell access transistor. Voltages in excess of that which would reduce reliability are avoided, and accurate driving voltages are obtained. A DRAM includes word lines, memory cells having enable inputs connected to the word lines, a gate receiving word line selecting signals at first logic levels $V_{ss}$ and $V_{dd}$, and for providing a select signal at levels $V_{ss}$ and $V_{dd}$, a high voltage supply source $V_{pp}$ which is higher in voltage than $V_{dd}$, a circuit for translating the select signals at levels $V_{ss}$ and $V_{dd}$ to levels $V_{ss}$ and $V_{pp}$ and for applying it directly to the word lines whereby an above $V_{dd}$ voltage level word line is achieved without the use of double boot-strap circuits.

Figure 1:
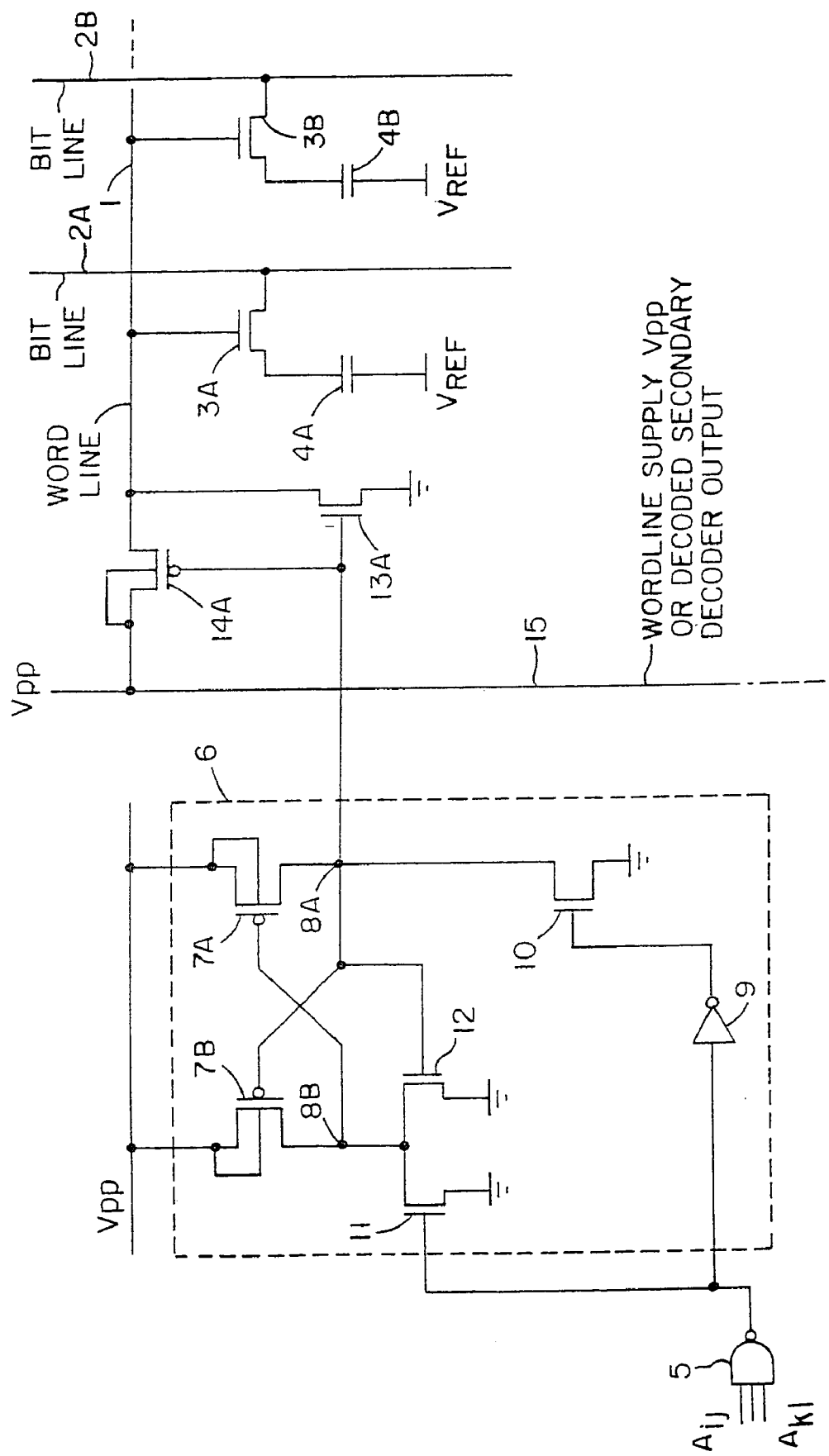

1 Claim, 1 Drawing Sheet

DYNAMIC MEMORY WORD LINE DRIVER SCHEME

RELATED APPLICATIONS

This application is a Continuation of application Ser. No. 10/463,194, filed on Jun. 17, 2003 now abandoned, which is a Continuation of application Ser. No. 09/919,752, filed on Jul. 31, 2001, now U.S. Pat. No. 6,603,703, which issued on Aug. 5, 2003, which is a Continuation of application Ser. No. 09/548,879, filed on Apr. 13, 2000, now U.S. Pat. No. 6,278,640, which issued on Aug. 21, 2001, which is a Continuation of application Ser. No. 09/123,112, filed on Jul. 27, 1998, now U.S. Pat. No. 6,061,277, which issued on May 9, 2000, which is a Continuation of application Ser. No. 08/705,534, filed on Aug. 29, 1996, now abandoned, which is a Continuation of application Ser. No. 08/611,558, filed on Mar. 6, 1996, now U.S. Pat. No. 5,751,643, which issued on May 12, 1998, which is a Continuation-in-Part of application Ser. No. 08/515,904, filed on Aug. 16, 1995, now U.S. Pat. No. 5,822,253, which issued on Oct. 13, 1998, which is a Continuation of application Ser. No. 08/205,776, filed on Mar. 3, 1994, now abandoned, which is a File Wrapper Continuation of application Ser. No. 08/031,898, filed on Mar. 16, 1993, now abandoned, which is a Continuation of application Ser. No. 07/680,746, filed on Apr. 5, 1991, now U.S. Pat. No. 5,214,602, which issued on May 25, 1993, which relates to Japanese Application No. 9107165, filed on Apr. 5, 1991 and United Kingdom Application No. 9007790.0, filed on Apr. 6, 1990. The entire teachings of the above applications are incorporated herein by reference.

FIELD OF THE INVENTION

This invention relates to CMOS dynamic random access memories (DRAMs), and particularly to word line drivers.

BACKGROUND TO THE INVENTION

Dynamic random access memories are generally formed of a matrix of bit lines and word lines with memory cells located adjacent the intersections of the bit lines and word lines. The memory cells are enabled to provide the stored bits to the bit lines or to permit a write operation by signals carried on the word lines.

Each memory cell is typically formed of a bit store capacitor connected to a reference voltage and through the source-drain circuit of an "access" field effect transistor to an associated bit line. The gate of the field effect transistor is connected to the word line. A logic signal carried by the word line enables the transistor, thus allowing charge to flow through the source-drain circuit of the transistor to the capacitor, or allowing charge stored on the capacitor to pass through the source-drain circuit of the access transistor to the bit line.

In order for the logic level $V_{dd}$ potential from the bit line to be stored on the capacitor, the word line must be driven to a voltage above $V_{dd}+V_{tn}$, where $V_{tn}$ is the threshold voltage or the access transistor including the effects of back bias.

During the early days of DRAM design, NMOS type FETs, that is, N-channel devices were used exclusively. In order to pass a $V_{dd}+V_{tn}$ level signal to the selected word line, the gate of the pass transistor had to be driven to at least $V_{dd}+2V_{tn}$. Furthermore, to allow sufficient drive to achieve a voltage greater than $V_{dd}+V_{tn}$ on the word line within a reasonable length of time in order to facilitate a relatively fast memory, the gate of the pass transistor is driven to a significantly higher voltage. In such devices, the word line driving signal utilized capacitors in a well-known double-boot strap circuit.

In the above circuit, the boot strapping voltage circuit is designed to exceed the voltage $V_{dd}+2V_{tn}$, in order to ensure that temperature, power supply, and process variations would never allow the pass transistor driving voltage to fall below $V_{dd}+2V_{tn}$.

However, it has been found that in small geometry VLSI memories, the high voltages provided by the boot-strap circuits can exceed the tolerable voltages in the memory, thus adversely affecting reliability.

SUMMARY OF THE INVENTION

The present invention is a circuit which accurately controls the word line (pass transistor gate) driving voltage to a voltage which is both controlled and is not significantly greater than is needed to drive the word line. The elements of the present invention eliminate the need for a double-boot-strapping circuit, and ensure that no voltages exceed that necessary to fully turn on a memory cell access transistor. Accordingly, voltages in excess of that which would reduce reliability are avoided, and accurate driving voltages are obtained.

According to an embodiment of the invention a dynamic random access memory (DRAM) is comprised of word lines, memory cells having enable inputs connected to the word lines, apparatus for receiving word line selecting signals at first logic levels $V_{ss}$ and $V_{dd}$, and for providing a select signal at levels $V_{ss}$ and $V_{dd}$, a high voltage supply source $V_{pp}$ which is higher in voltage than $V_{dd}$, a circuit for translating the select signals at levels $V_{ss}$ and $V_{dd}$ to levels $V_{ss}$ and $V_{pp}$ and for applying it directly to the word lines for application to the enable inputs whereby an above $V_{dd}$ voltage level word line is achieved without the use of double boot-strap circuits.

According to another embodiment, a dynamic random access memory (DRAM) is comprised of bit-lines and word lines, memory cells connected to the bit lines and word lines, each memory cell being comprised of an access field effect transistor (FET) having its source-drain circuit connected between a bit line and a bit charge storage capacitor, the access field effect transistor having a gate connected to a corresponding word line; a high supply voltage source $V_{pp}$; a circuit or selecting the word line and a circuit having an input driven by the selecting apparatus for applying the $V_{pp}$ supply voltage to the word line.

BRIEF INTRODUCTION TO THE DRAWINGS

A better understanding of the invention will be obtained by reference to the detailed description below, in conjunction with the following drawings, in which;

FIG. 1 is a schematic diagram of the invention.

DESCRIPTION OF A PREFERRED EMBODIMENT OF THE INVENTION

Turning now to FIG. 1, a CMOS DRAM is comprised of word lines, represented by word line 1 and bit lines, represented by bit lines 2A, 2B, etc. Access transistors 3A, 3B have their gates connected to the word line; their sources are connected to bit charge storing capacitors 4A, 4B, etc. which are also connected to ground. The drains of access transistors 3A, 3B, etc. are connected to the bit lines 2A, 2B, etc.

With the application of a logic signal of $V_{dd}+V_{tn}$ to the gate of transistor 3A, 3B, etc., $V_{dd}$ level on the bit line 2A, 2B, etc. is fully transferred to the associated capacitor 4A, 4B, etc. during the writing cycle. In the prior art it was necessary to apply a voltage greater than $V_{dd}+2V_{tn}$ to the gate of an N-channel pass transistor in order to ensure that a voltage in excess of $V_{dd}+V_{tn}$ would be available at the gates of transistors 3A, 3B, etc.

The combination of a bit storing charge capacitor, e.g. 4A, with an associated access transistor, e.g. 3A, forms a memory cell in prior art DRAMs.

The word line is selected by means of addresses $A_{ij}$ applied to the inputs of a NAND gate 5. In the prior art a double boot-strap circuit was connected between the output NAND gate 5 and the word line.

In accordance with the present invention a voltage $V_{pp}$ which is higher than the logic level $V_{dd}+V_{tn}$ is utilized. A level shifter 6 is formed of a pair of cross coupled P-channel transistors 7A and 7B. The sources of transistors 7A and 7B are connected to the voltage source $V_{pp}$. The level shifter defines a first and a second control node, respectively 8A and 8B.

The output of NAND gate 5 is connected through an inverter 9 to the gate of an N-channel FET 10. FET 10 has its source connected to ground and its drain connected to control node 8A.

The output of NAND gate 5 is connected to the gate of an N-channel FET 11, which has its source connected to ground and its drain connected to control node 8B. A third N-channel FET 12 has its source connected to ground, its drain connected to the drain of transistor 11, and its gate to control node 8A.

Control node 8A (or a buffered version of control node 8A) is applied to the gate of pass transistor 14A and pull down transistor 3A. The source of pass transistor 14A is connected to $V_{pp}$ or to a secondary decoder output which provides a $V_{ss}$ or $V_{pp}$ level output; its drain to word line 1. The source of pull down transistor 13A is connected to ground; the drain is connected to word line 1.

In operation, assume that the word line 1 has not been selected. At least one address input of NAND gate 5 is low, causing the output of NAND gate 5 to be high, and the output of inverter 9 to be low. Transistor 11 is enabled, pulling node 8B to ground. Transistor 10 is disabled, allowing transistor 7A to charge node 8A to $V_{pp}$. Transistor 12 is thus enabled ensuing that node 8A is pulled high. The $V_{pp}$ level node 8A disables the pass device 14A and enables pull down transistor 13A so that word line 1 is held at ground. Thus transistors 3A and 3B are not enabled and are not conducting. The charge stored on capacitors 4A and 4B are thus maintained, and are not read to the bit lines.

Assume now that word line 1 is selected. Logic high level address signals at the voltage level $V_{dd}$ are applied to the inputs of NAND gate 5. The output of the NAND gate thus goes to low level. The output of inverter 9 changes to high level, transistor 10 is enabled, and pulls node 8A toward ground. This causes transistor 7B to be enabled, and pull node 8B toward $V_{pp}$. This causes transistor 7A to be disabled so that node 8A is pulled to ground, disabling transistor 12 and allowing transistor 7B to charge node 8B to $V_{pp}$. The ground level voltage on node 8A disables pull down transistor 13A, and enables the pass transistor 14A so that the word line 1 is driven to a $V_{pp}$ level. The voltage on the word line is thus controlled, and depending on whether the word line is selected or not, it switches between ground and $V_{pp}$. With the voltage $V_{pp}$ being controlled to $V_{dd}+V_{tn}$, the voltage at the gates of the cell access transistors 3A and 3B is certain to be $V_{dd}+V_{tn}$. However the voltage $V_{pp}$ is selected to be less than a voltage that would be in excess of that which would deteriorate reliability of the DRAM.

A person understanding this invention may now conceive of alternative structures and embodiments or variations of the above. All of those which all within the scope of the claims appended hereto are considered to be part of the present invention.

What is claimed is:

1. A method of selecting a word line in a dynamic random access memory to store a voltage level in a memory cell comprising:

coupling a controlled high supply voltage level that is greater than the voltage level stored in the memory cell to a level shifter circuit, the level shifter circuit comprising a pair of cross-coupled transistors connected drain-to-gate and having respective sources coupled to the controlled high supply voltage;

coupling a logic signal having only logic levels that are less than the controlled high supply voltage level to the level shifter circuit to produce a control signal having a logic state at the controlled high supply voltage level; and driving a selected word line to the controlled high supply voltage level in response to the control signal.

* * * * *